United States Patent [19]

Branan, Jr.

[11] Patent Number: 5,177,355
[45] Date of Patent: Jan. 5, 1993

[54] ROTARY CONTROL SWITCH WITH PLURAL MOVABLE CONCAVE LIGHT REFLECTORS

[75] Inventor: Mac W. Branan, Jr., Fort Lauderdale, Fla.

[73] Assignee: Motorola, Inc., Schaumburg, Ill.

[21] Appl. No.: 677,910

[22] Filed: Apr. 10, 1991

[51] Int. Cl.⁵ ............................................. G01D 5/34
[52] U.S. Cl. .................................. 250/229; 200/61.02
[58] Field of Search .................... 200/61.02; 250/229, 250/239; 341/31

[56] References Cited

U.S. PATENT DOCUMENTS

| | | | |
|---|---|---|---|
| 4,013,342 | 3/1977 | Narodny | 250/229 |
| 4,015,253 | 3/1977 | Goldstein . | |
| 4,634,861 | 1/1987 | Ching et al. | 250/229 |
| 4,831,253 | 5/1989 | Omura et al. . | |
| 4,906,846 | 3/1990 | Arimura | 250/229 |
| 4,964,693 | 10/1990 | Branan, Jr. et al. . | |
| 5,061,848 | 10/1991 | Choi | 250/229 |

*Primary Examiner*—David C. Nelms
*Attorney, Agent, or Firm*—Michael J. Buchenhorner

[57] ABSTRACT

A switch (10) comprises a rotary part (12, 14, 16 and 18) and a bracket (24) for supporting the rotary part. The rotary part comprises a knob (12), a shaft (14), attached to, or formed on, the knob, a detent cam (16) attached to, or formed on, the shaft, and a light director (18), attached to the shaft, for directing light from an external light source to a light receiver when the switch is in a first position and for directing light from the light source away from the light receiver when the switch is in a second position. The bracket comprises a detent spring (17) for making contact with the detent cam to provide operating positions for the switch.

16 Claims, 3 Drawing Sheets 5,177,355

ROTARY CONTROL SWITCH WITH PLURAL MOVABLE CONCAVE LIGHT REFLECTORS

TECHNICAL FIELD

This invention relates generally to rotary controls.

BACKGROUND

Switches and other controls for electronic devices are normally discrete component assemblies. Separate interconnections must be made from the control component to the rest of the electronic device, usually contained on a printed circuit board (PCB). These interconnections can consume available space that is often at a premium in small electronic devices such as portable radios. Moreover, making these interconnections complicates the assembly process, and creates the possibility of quality problems caused by PCB contamination and contact failure.

Switches that operate using light to control an apparatus are known (e.g., U.S. Pat. No. 4,015,253), however such approaches consume as much space as the interconnections that are replaced (if any are replaced) and are relatively difficult to manufacture. Thus, a need exists for a switch that can be easily manufactured and consumes a small portion of the apparatus in which it is contained.

SUMMARY OF THE INVENTION

Briefly, according to the invention, a switch comprises a rotary part and a bracket for supporting the rotary part. The rotary part comprises a knob, a shaft, extending from the knob, a detent cam attached, or formed on, the shaft, and a light director, attached to, or formed on, the shaft, for directing light from a light source to a light receiver when the switch is in a first position and for directing light from the light source away from the light receiver when the switch is in a second position. The bracket comprises a detent spring for making contact with the detent cam to provide operating positions for the switch.

DETAILED DESCRIPTION OF THE PREFERRED EMBODIMENT

Figures 1, 2:
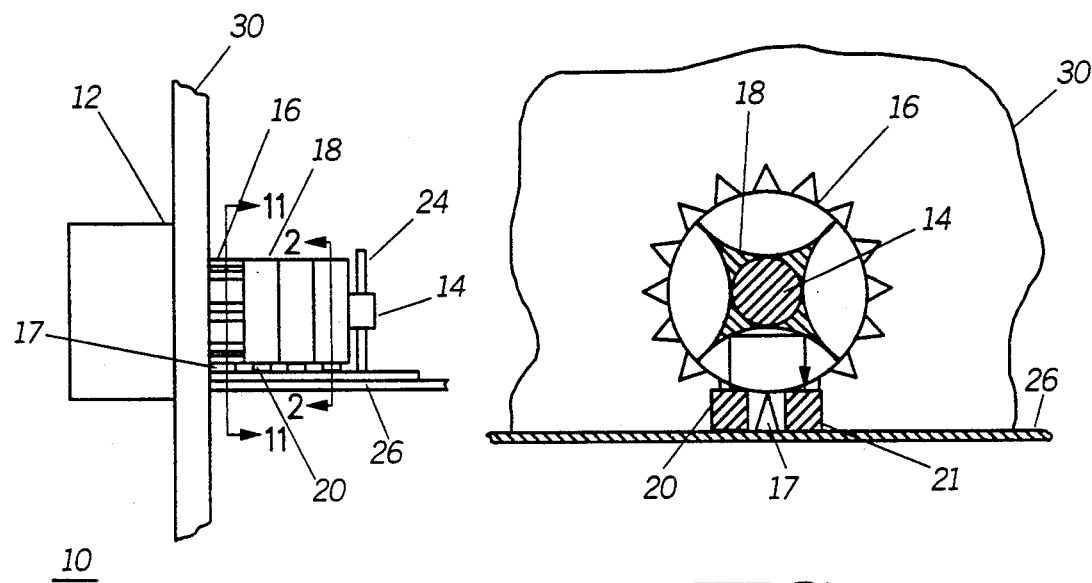
FIG. 1 is a side view of a switch in accordance with the invention.
FIG. 2 is a section view taken along the lines 2—2 of FIG. 1.

Referring to FIG. 1, a control switch 10 in accordance with the invention is shown. The switch 10 includes a knob 12, a shaft 14, rigidly attached or secured to the knob 12, and a frame or bracket 24 for supporting the shaft 14. The bracket 24 may also perform locating-/securing and shielding functions. The bracket 24 is preferably made from stamped sheet metal and reflow soldered to a printed circuit board. A detent cam 16 is also attached (or integrally formed on) to the shaft. The detent cam 16 may include teeth or other detent mechanisms that can be used (in conjunction with a cam follower) to provide operating positions for the switch 10. A reflector cam 18 is also attached to (or integrally formed on) the shaft 14. In this embodiment, the switch 10 is mounted on a radio housing 30 so that the switch 10 may be used to control circuitry within the radio housing 30. A circuit board 26 containing a light source 20, and a light receiver 21 mounted thereon completes a switch assembly. The light source 20 is external to the switch and is preferably a light emitting diode (LED) or equivalent means; and the light receiver 21 is preferably a phototransistor, or equivalent means. Light sources and receivers operating with different frequencies of light (e.g., infrared or visible light) may be used.

The invention eliminates separate discrete switching and analog controls through integration of control functions with the structure of the switch already present in the radio. Thus, manufacturing is made easier by the elimination of the discrete switching and analog controls and the separate interconnections generally associated with them, and reliability is enhanced (because there is less to go wrong). Moreover, the elimination of parts increases the amount of useable space in the electronic apparatus containing the switch 10.

Figures 3, 4:
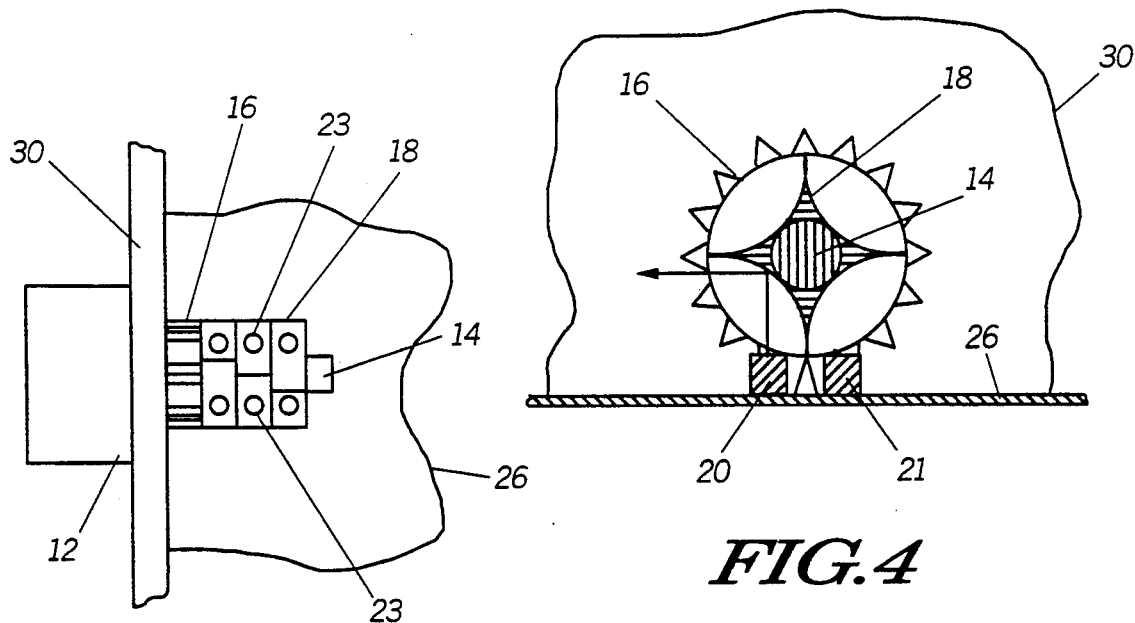
FIG. 3 is a top view of a switch in accordance with the invention.
FIG. 4 is a section view taken along the lines 2—2 of FIG. 1 showing the switch in a different position.

Referring to FIG. 2, a section view taken along the lines 2—2 of FIG. 1 is shown. The reflector cam 18 has four elliptical reflecting surfaces 28 for reflecting the light emitted by LED 20 to phototransistor 21 when the reflector cam 18 is in the position shown in FIG. 2 and when the switch 10 is in a first position (i.e., that shown in FIG. 2), and directs light from the light source 20 away from the light receiver 21 when the switch is in a second position, as shown in FIG. 4. A cam-follower spring 17 is mounted on the bracket 24 to work in conjunction with the detent cam 16.

Referring to FIGS. 3 and 4, the LEDs 20 and the phototransistors 21 are arranged in pairs to correspond to the positions 23 so that some (or all) of the pairs will complete light circuits when the reflector cam 18 is positioned so that a concave portion of its surface reflects a substantial amount of light (i.e., enough to complete the light circuit) to the phototransistor 21 (as in FIG. 2). As the knob 12 is rotated by a radio user, the elliptical reflecting surfaces cause light emitted by the LEDs 20 to diverge from or converge to the phototransistors 21 producing a pattern which may be interpreted by a controller in the radio for the appropriate control functions. The number of LED/phototransistor pairs is determined by the number of positions required (e.g., eight positions requires 3 pairs in a Grey binary code). The LEDs 20 are preferably strobed to reduce average current drain and to allow AC (alternating current) coupling of phototransistors in ambient light.

Figure 5:
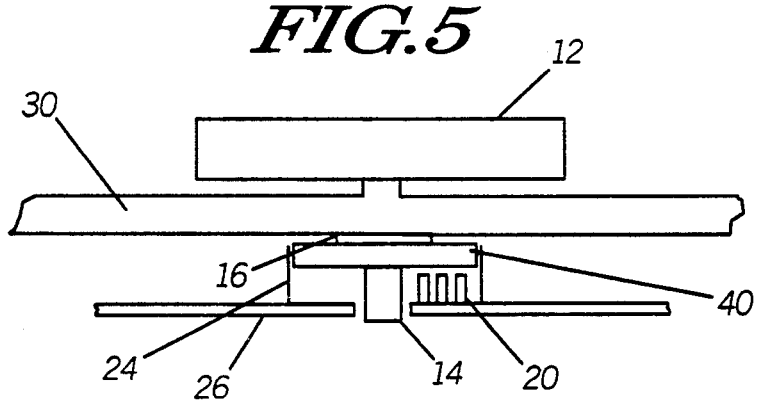
FIG. 5 shows a side view of an alternate embodiment of a switch in accordance with the invention.

Referring to FIG. 5, an alternate embodiment of the switch 10, in which the shaft 14 is perpendicular to the circuit board 26, is shown. In this embodiment, the LEDs 20 and phototransistors 21 are mounted on the circuit board 26 and located under the reflector cam 40.

Figure 6:
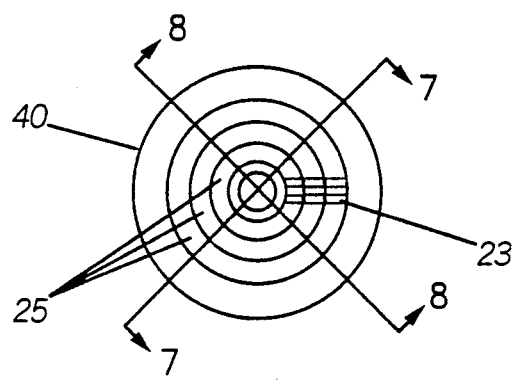
FIG. 6 shows a bottom view of a light directing cam in accordance with the invention.

Referring to FIG. 6, a bottom view of the cam 40 is shown. The locations 23 of the LEDs 20 and phototransistors 21 with respect to the cam 40 correspond to concave portions 25 of the cam 40.

Figure 7:
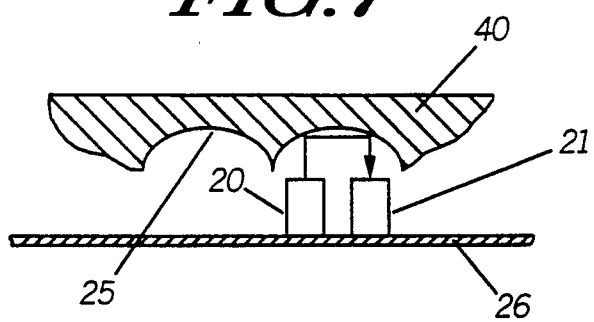
FIG. 7 shows a cross section taken across line 7—7 in FIG. 6.

Referring to FIG. 7, a cross section of the cam 40, taken across line 7—7 in FIG. 6, is shown. When the cam 40 is in this position, the concave portion of the cam 40 aligns with the LED/phototransistor pair (20/21) so that the elliptical reflecting surface (with the LED 20 and the phototransistor 21 at focal points) reflects a light beam from the LED 20 to the phototransistor 21.

Figure 8:
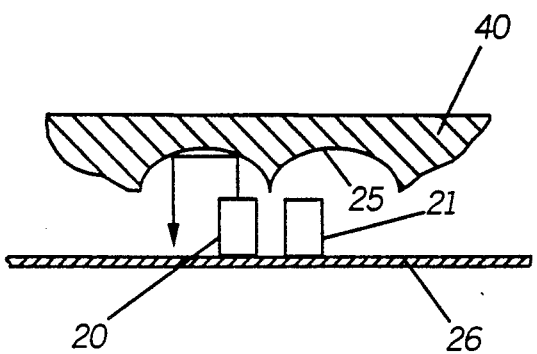
FIG. 8 shows a cross section taken across line 8—8 in FIG. 6.

Referring to FIG. 8, a cross section of the cam 40, taken across line 8—8 in FIG. 6, is shown. When the cam 40 is in this position, light is deflected away from the phototransistor 21.

Figure 9:
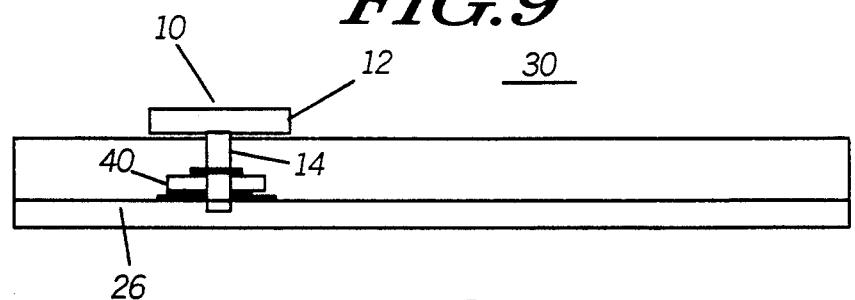
FIGS. 9 and 10 show cross sections of a radio housing illustrating alternate embodiments of the invention.
Figure 10:
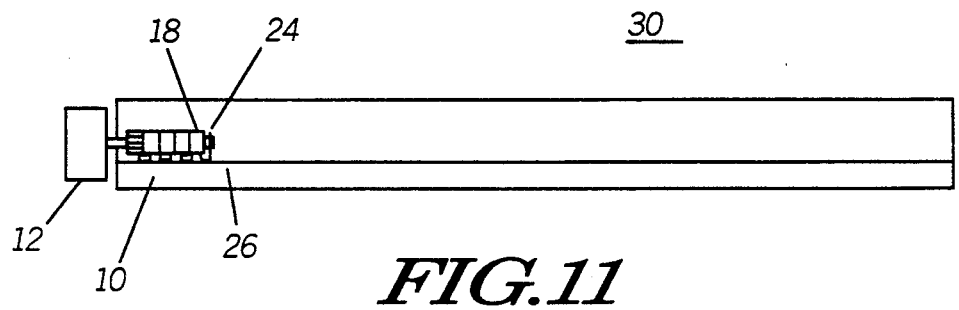

Referring to FIGS. 9 and 10, cross sections of the radio housing 30 are shown illustrating the alternate embodiments described herein. In FIG. 9 the switch element 10 is secured by the housing 30 on top and the circuit board 26 on the bottom. In FIG. 10, the switch element 10 is secured by the housing 30 on the left, and the bracket 24 on the right.

Figure 11:
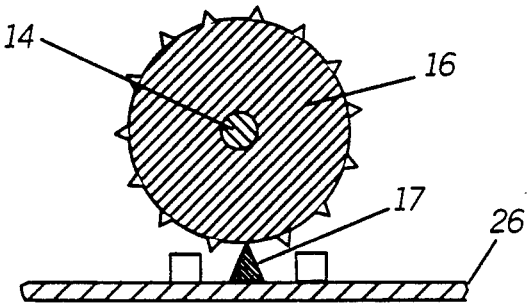
FIG. 11 shows a cross section taken across line 11—11 of FIG. 1.

Referring to FIG. 11, a section view taken along the lines 11—11 of FIG. 1 is shown. The teeth of detent cam 16 are shown making contact with the detent cam-follower spring 17.

Figure 12:
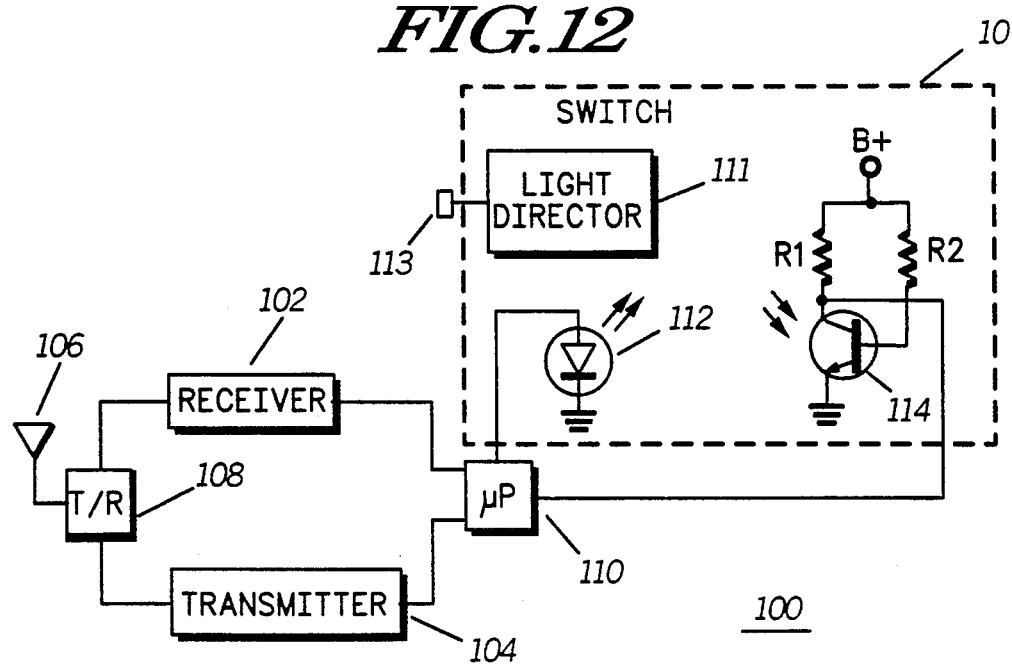
FIG. 12 shows a schematic diagram of a radio having a switch in accordance with the invention.

Referring to FIG. 12, a radio 100 including a switch 10 in accordance with the invention is shown. The radio 100 further includes a conventional receiver 102, a conventional transmitter 104, both coupled to an antenna 106 via a transmit/receive switch 108, and a microprocessor 10. The switch 110 has an LED 112, and a phototransistor 114 both coupled to the microprocessor 110 for providing control signals thereto. A user of the radio 100 may convey desired commands to the radio 100 by turning the knob 113. The rotation of knob 113 results in the operation of the light director 111 as discussed with reference to the previous figures. Resistors R1 and R2 provide the required bias to phototransistor 114. When the light director 111 directs light from the LED 112 to the phototransistor 114 a desired command is conveyed to the microprocessor 110. The radio 100 is preferably a portable radio wherein the space saving offered by the invention may be advantageously used.

What is claimed is:

1. A switch comprising:
 a rotary part comprising:
   a knob;
   a shaft extending from the knob;
   a detent cam attached to, or formed on, the shaft; and
   a plurality of concave reflecting surfaces located on the shaft, attached to, or formed on, the shaft, for directing light from an external light source to a light receiver when the switch is in a first position and for directing light from the light source away from the light receiver when the switch is in a second position; and
 a bracket for supporting the rotary part, the bracket comprising a detent spring for making contact with the detent cam to provide operating positions for the switch.

2. The switch of claim 1, wherein the light director means comprises a surface that reflects substantial light from the light source to the light receiver when the switch is in the first position, and that reflects substantially less light from the light source to the light receiver when the switch is in the second position.

3. The switch of claim 1, wherein the light source comprises a light emitting diode.

4. The switch of claim 3, wherein the light receiver comprises a phototransistor.

5. The switch of claim 1, wherein the light director means comprises a plurality of concave reflecting surfaces located on the shaft means so that light emitted from the light source is reflected to the light receiver when the switch is in the first position and light from the light source is reflected away from the light receiver when the switch is in the second position.

6. The switch of claim 4, wherein the light director means comprises a plurality of concave reflecting surfaces located on the shaft means so that light emitted from the light source is reflected to the light receiver when the switch is in the first position and light from the light source reflected away from the light receiver when the switch is in the second position.

7. A switch assembly comprising:
 a rotary part comprising:
   a knob;
   shaft means, extending from the knob;
   a detent cam attached to, or formed on, the shaft means; and
   a plurality of concave reflecting surfaces located on the shaft, or formed on, the shaft means, for directing light from an external light source to a light receiver when the switch is in a first position and for directing light from the light source away from the light receiver when the switch is in a second position;
 a bracket for supporting the rotary part, the bracket comprising a detent spring for making contact with detent cam to provide operating positions for the switch; and
 a circuit board having the bracket, the light source, and the light receiver mounted thereon.

8. The switch of claim 7, wherein the light director means comprises a surface that reflects substantial light from the light source to the light receiver when the switch is in the first position, and that reflects substantially less light from the light source to the light receiver when the switch is in the second position.

9. The switch of claim 7, wherein the light source comprises a light emitting diode.

10. The switch of claim 9, wherein the light receiver comprises a phototransistor.

11. The switch of claim 10, wherein the light director means comprises a plurality of concave reflecting surfaces located on the shaft means so that light emitted from the light source is reflected to the light receiver when the switch is in the first position and light from the light source is reflected away from the light receiver when the switch is in the second position.

12. A radio comprising:
 transceiver means;
 controller means for controlling the transceiver means;
 switch means coupled to the controller means, the switch means comprising:
  a rotary part comprising:
   a knob;
   shaft means, extending from the knob;

a detent cam attached to, or formed on, the shaft means; and a plurality of concave reflecting surfaces located on the shaft, attached to, or formed on, the shaft means, for directing light from an external light source to a light receiver when the switch is in a first position and for directing light from the light source away from the light receiver when the switch is in a second position;

a bracket for supporting the rotary part, the bracket comprising a detent spring for making contact with the detent cam to provide operating positions for the switch; and a circuit board having the bracket, the light source, and the light receiver mounted thereon.

13. The switch of claim 12, wherein the light director means comprises a surface that reflects substantial light from the light source to the light receiver when the switch is in the first position, and that reflects substantially less light from the light source to the light receiver when the switch is in the second position.

14. The switch of claim 12, wherein the light source comprises a light emitting diode.

15. The switch of claim 14, wherein the light receiver comprises a phototransistor.

16. The switch of claim 15, wherein the light director means comprises a plurality of concave reflecting surfaces located on the shaft means so that light emitted from the light source is reflected to the light receiver when the switch is in the first position and light from the light source is reflected away from the light receiver when the switch is in the second position.

* * * * *